(12) United States Patent
Mueller et al.

(10) Patent No.: US 12,443,116 B2
(45) Date of Patent: Oct. 14, 2025

(54) MACHINE MEASUREMENT METROLOGY FRAME FOR A LITHOGRAPHY SYSTEM

(71) Applicant: Applied Materials, Inc., Santa Clara, CA (US)

(72) Inventors: Ulrich Mueller, Berkeley, CA (US); David Arthur Markle, Pleasanton, CA (US); Stephen F. Sporer, Berkeley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 18/000,035

(22) PCT Filed: Jun. 15, 2020

(86) PCT No.: PCT/US2020/037801
§ 371 (c)(1),
(2) Date: Nov. 28, 2022

(87) PCT Pub. No.: WO2021/257055
PCT Pub. Date: Dec. 23, 2021

(65) Prior Publication Data
US 2023/0221658 A1    Jul. 13, 2023

(51) Int. Cl.
*G03F 7/00* (2006.01)

(52) U.S. Cl.
CPC ........ *G03F 7/7085* (2013.01); *G03F 7/70508* (2013.01); *G03F 7/70725* (2013.01); *G03F 7/70775* (2013.01); *G03F 7/70791* (2013.01)

(58) Field of Classification Search
CPC .................. G03F 7/70775; G03F 7/70725
See application file for complete search history.

(56) References Cited

U.S. PATENT DOCUMENTS

| | | | |
|---|---|---|---|
| 9,768,722 B1 | 9/2017 | Lin | |
| 2002/0104231 A1* | 8/2002 | Tominaga | H01L 21/681 33/DIG. 21 |
| 2009/0284723 A1 | 11/2009 | Shibazaki | |
| 2010/0134769 A1* | 6/2010 | Mulkens | G03F 7/70808 355/77 |

(Continued)

FOREIGN PATENT DOCUMENTS

| | | | | |
|---|---|---|---|---|
| TW | 201940996 A | 10/2019 | | |
| WO | WO-2017057465 A1 * | 4/2017 | ............. | G03F 7/707 |

OTHER PUBLICATIONS

Machine translation of WO-2017057465-A1 (Year: 2017).*

(Continued)

*Primary Examiner* — Steven H Whitesell
(74) *Attorney, Agent, or Firm* — Patterson + Sheridan, LLP

(57) ABSTRACT

The present disclosure relates to apparatus and methods for performing maskless lithography processes. A substrate processing apparatus includes a slab with a plurality of guiderails coupled to and extending along the slab. A first shuttle is disposed on the plurality of guiderails, a second shuttle is disposed on the first shuttle, and a metrology bar is coupled to the second shuttle. The metrology bar includes a first plurality of sensors coupled to the metrology bar. A second plurality of sensors coupled to the metrology bar are disposed laterally inward of the first plurality of sensors.

19 Claims, 6 Drawing Sheets

(56) References Cited

U.S. PATENT DOCUMENTS

| | | | |
|---|---|---|---|
| 2011/0102761 A1* | 5/2011 | Yoshimoto | G03F 7/70725 355/72 |
| 2011/0176123 A1 | 7/2011 | Seijger et al. | |
| 2017/0090303 A1 | 3/2017 | Johnston et al. | |
| 2019/0371643 A1* | 12/2019 | Aoki | G03F 7/70775 |
| 2020/0019065 A1 | 1/2020 | Chen et al. | |

OTHER PUBLICATIONS

International Search Report issued to PCT/US2020/037801 on Mar. 12, 2021.
Taiwan Office Action issued to patent application No. 110121628 on Mar. 5, 2025.

* cited by examiner

MACHINE MEASUREMENT METROLOGY FRAME FOR A LITHOGRAPHY SYSTEM

This application is a national stage application under 35 U.S.C. 371 of PCT/US2020/037801, filed Jun. 15, 2020 which is hereby assigned to the assignee hereof, and hereby expressly incorporated by reference herein in its entirety as if fully set forth below and for all applicable purposes.

BACKGROUND

Field

Embodiments of the present invention generally relate to systems and methods for processing one or more substrates, and more specifically to systems and methods for performing photolithography, metrology, and inspection processes.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs are one type of flat panel display which is commonly used for active matrix displays, in devices such as computers, touch panel devices, personal digital assistants, cell phones, television monitors, and the like. Some flat panel displays include a layer of liquid crystal material sandwiched between cross polarizers. The liquid crystal material is also sandwiched between two electrically conductive plates. When a voltage from a power supply is applied across or through the liquid crystal material, an amount of light passing through the liquid crystal material is varied and the light transmission through the crossed polarizers is also varied. The technology enables the light transmission of each pixel in a closely packed array of pixels to be selectively modulated and generate images on the display.

Lithography techniques are generally employed to create electrical features incorporated as part of the liquid crystal material layer forming the pixels. According to this technique, a light-sensitive photoresist is typically applied to one surface of the substrate. Then, a pattern generator exposes selected areas of the light-sensitive photoresist to cause chemical changes to the photoresist in the selective areas to prepare these selective areas for subsequent material removal and/or material addiction processes to create the electrical features.

During the pattern generation process, it is beneficial to know the exact location of the substrate with respect to the pattern imaging system because even the slightest difference in position of the substrate can cause mura or blurriness in the image generated on the substrate. Current lithography systems often employ laser interferometers to determine the position of the substrate relative to the pattern generator. Such systems are expensive and potentially vulnerable to various environmental factors, such as system vibration and changes in the interferometer air path.

To provide display devices and other devices to consumers at the prices demanded by consumers, new apparatuses and approaches are needed to precisely and cost-effectively create patterns on substrates such as a large area substrate. More specifically, what is need in the art is a machine measurement metrology system for a lithography system that accurately measures the position of a processing stage relative to a fixed processing unit and related methods of use.

SUMMARY

Embodiments of the present disclosure generally relate to apparatus and methods for performing photolithography processes. In one embodiment, a substrate processing apparatus includes a slab with a plurality of guiderails coupled to and extending along the slab. A first shuttle is disposed on the plurality of guiderails, a second shuttle disposed on the first shuttle, and a metrology bar coupled to the second shuttle. The metrology bar includes a first plurality of sensors coupled to the metrology bar. A second plurality of sensors coupled to the metrology bar are disposed laterally inward of the first plurality of sensors.

In one embodiment, a substrate processing apparatus includes a slab, a plurality of guiderails coupled to and extending along the slab, a processing unit coupled to the slab by a support, a first shuttle disposed on the plurality of guiderails, a second shuttle disposed on the plurality of guiderails opposite the first shuttle, a third shuttle comprising a first chuck disposed on the first shuttle, a fourth shuttle comprising a second chuck disposed on the second shuttle, and a first metrology bar coupled to the first chuck and a second metrology bar coupled to the second chuck. Each of the first metrology bar and the second metrology bar comprise a first plurality of sensors disposed at distal ends of the metrology bar and a second plurality of sensors disposed laterally inward of the first plurality of sensors.

In another embodiment, a substrate processing method comprises positioning a substrate on a chuck, wherein the chuck is coupled to a second shuttle disposed on a first shuttle. The first shuttle determining, via a metrology bar comprising sensors coupled to the chuck opposite the substrate, a position of the substrate within a processing unit and in response to determining the position of the substrate, moving one or both of the first shuttle and the second shuttle to position the substrate relative to the processing unit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus and methods for performing photolithography processes, metrology, or inspection utilizing a precisely metered, two-dimensional stage. More specifically, the embodiments of the present disclosure relate to apparatus and methods for determining the position of a substrate during lithography or inspection operations, including maskless lithography operations, and further providing feedback in real time to a processing unit. In one embodiment, the substrate processing apparatus includes a slab with a plurality of guiderails coupled to and extending along the slab. A first shuttle and a second shuttle are disposed on the plurality of guiderails. Guiderails are disposed on both the first shuttle and the second shuttle normal to the guiderail on the slab. A third shuttle and a fourth shuttle are coupled to the guiderails of the first and second shuttles. A plurality of metrology bars are coupled to the third and fourth shuttles. The metrology bar includes a first plurality of sensors coupled to the metrology bar. A second plurality of sensors coupled to the metrology bar are disposed laterally inward of the first plurality of sensors.

Figure 1:
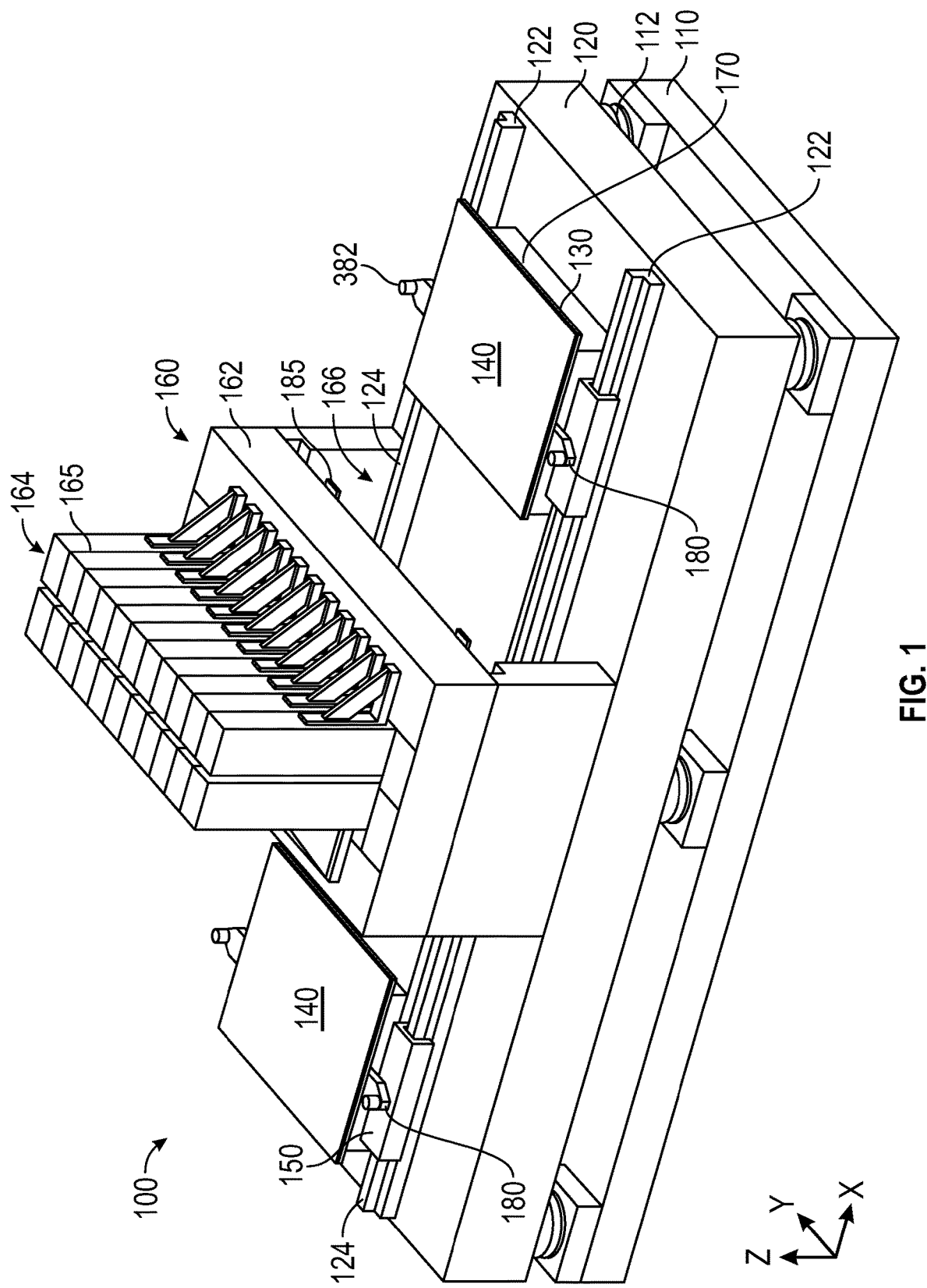
FIG. 1 is a perspective schematic view of a system that may benefit from the embodiments disclosed herein.

FIG. 1 is a perspective view of system 100 that may benefit from embodiments disclosed herein. The system 100 includes a base frame 110, a slab 120, two or more chucks 130, and a processing unit 160. The base frame rests on the floor of a fabrication facility and supports the slab 120. Passive air isolators 112 are positioned between the base frame 110 and the slab 120. The passive air isolators 112 enable a reduction in vibrational movement of slab 120 relative to the base frame 110. The slab 120 may be fabricated from various materials generally having a high stiffness and on which a very flat surface can be generated. In one embodiment, the slab 120 is a monolithic piece of granite.

A first shuttle 150 and a second shuttle 170 are disposed on the slab 120 within the system 100. The second shuttle 170 is coupled to the first shuttle 150 and a chuck 130 is disposed on the second shuttle 170. The chucks 130 are aligned in a first direction, such as the X-direction, as shown in FIG. 1. A substrate 140 is respectively supported by each of the chucks 130. A plurality of holes (not shown) are formed in each chuck 130 for enabling a plurality of lift pins (not shown) to extend therethrough. The lift pins rise to an extended position to receive the substrate, such as from a transfer robot (not shown). The transfer robot positions the substrate 140 on the lift pins, and the lift pins lower the substrate 140 onto each chuck 130.

The substrate 140 is made of alkaline earth boro-aluminosilicate glass and is used as part of a flat panel display. In other embodiments, the substrate 140 may be made of other materials. In some embodiments, the substrate 140 is coated with a photoresist. The photoresist is sensitive to radiation and may be a positive photoresist or a negative photoresist. For example, portions of the photoresist exposed to radiation are rendered soluble or insoluble, respectively, to photoresist developer, which is applied to the photoresist after the pattern is written into the photoresist by exposure to electromagnetic radiation. The chemical composition of the photoresist determines whether the photoresist will be a negative photoresist or a positive photoresist. For example, the photoresist includes at least one of diazonapthoquinone, a phenol formaldehyde resin, poly(methyl methacrylate), poly(methyl glutraimide), and SU-8. In this manner, the pattern is created in the resist layer, which after development and etching, is transferred to an underlying layer on a surface of the substrate 140 to form an electronic circuitry component.

The system 100 further includes a pair of supports 122 and a pair of guiderails 124. The pair of supports 122 are disposed on the slab 120. In one embodiment, the pair of supports 122 and pair of guiderails 124 are individual components and are fabricated from the same or different materials. In another embodiment, the pair of supports 122 and pair of guiderails 124 are a single piece of material. In another embodiment, the pair of supports 122 and the pair of guiderails 124 are integrally formed with the slab 120. In another embodiment, the pair of guiderails 124 are disposed on the pair of supports 122. The guiderails 124 and supports 122 are fabricated from the same material or different materials. In one embodiment, the slab 120, the pair of supports 122, and the pair of guiderails 124 are fabricated from a single piece of material. The pair of supports 122 and pair of guiderails 124 are positioned substantially parallel to one another and extend along the slab 120 in the X-direction.

The first shuttle 150 is disposed on guiderails 124. In operation, the first shuttle 150 moves along the guiderails 124 in a first direction, such as the X-direction. In one embodiment, the pair of guiderails 124 is a pair of parallel magnetic channels. As shown, each track of the pair of guiderails 124 is linear. In other embodiments, the guiderails 124 are non-linear shapes. The second shuttle 170 is disposed on the first shuttle 150 and the second shuttle 170 is configured move along the first shuttle 150 in a direction normal to the first shuttle 150, such as Y-direction.

The processing apparatus 160 includes a support 162 and a processing unit 164. The support 162, which supports the processing unit 164, is disposed on the slab 120 and includes an opening 166 for the chucks 130 to pass under the processing unit 164. In one embodiment, the processing unit 164 is a pattern generator configured to expose a photoresist in a photolithography process. In another embodiment, the pattern generator is configured to perform a maskless lithography process. The processing unit 164 includes a plurality of image projection systems disposed in a case 165. The processing apparatus 160 is utilized to perform maskless direct patterning. During operation, one of the two or more chuck 130 assemblies disposed on the pair of guiderails 124 moves in the X-direction from a loading position, as shown in FIG. 1, to a processing position. The processing position refers to one or more positions of the chuck 130 as the chuck 130 passes under the processing unit 164.

A pair of scales 185 (illustrated in detail in FIGS. 3, 4, and 6) are disposed in the opening 166. In one embodiment, the scales 185 are encoder scales. In one embodiment, the scales 185 are mounted to an inner wall 128 of the opening 166. In another embodiment, the encoder scales 185 are coupled to a bottom 163 of the support 162 within the opening 166. The scales 185 are disposed and extend collinearly with the guiderails 124. In one embodiment, the scales 185 are substantially vertically aligned with the guiderails 124. Alternatively, the scales 185 may be positioned laterally outward of the guiderails 124. In one embodiment, the scales 185 are made of a ceramic material, a glass material, or other suitable material. The scales 185 include etchings or markings which are configured to provide position data to read head sensors 382 (illustrated in detail with regard to FIGS. 4, 5, and 6) of a metrology bar 180.

During operation, the two or more chucks 130 move along the pair of guiderails 124 via the first shuttle 150 and through the opening 166 to pass under the processing apparatus 160. The two or more chucks 130 are also capable of movement in the second direction, such as the Y-direction by movement of the second shuttle 170. Thus X-Y motion of the chucks 130 and substrates 140 disposed thereon is enabled by the first shuttle 150 and the second shuttle 170. It is also contemplated that the chucks 130 are capable of movement vertically in the Z direction if desired by movement of one or both of the first shuttle 150 and the second shuttle 170.

The metrology bar 180 is coupled to the chuck 130 opposite a surface of the chuck 130 which supports the substrate 140. The metrology bar 180, which has read head sensors 382 at opposing ends thereof, extends in a direction perpendicular to a major axis of the parallel guiderails 124. The read head sensors 382 are substantially aligned below the scales 185 during movement of the chucks 130 within or adjacent to the opening 166. The metrology bar 180 is utilized to provide the relative location of the chucks 130, and thus the substrate 140, to the processing unit 164 to enable more precise patterning of the substrate 140. The metrology bar 180 enables vibration and stray displacement of the slab 120 to be detected, measured, and accounted for when determining the position of the substrate 140.

Figure 2:
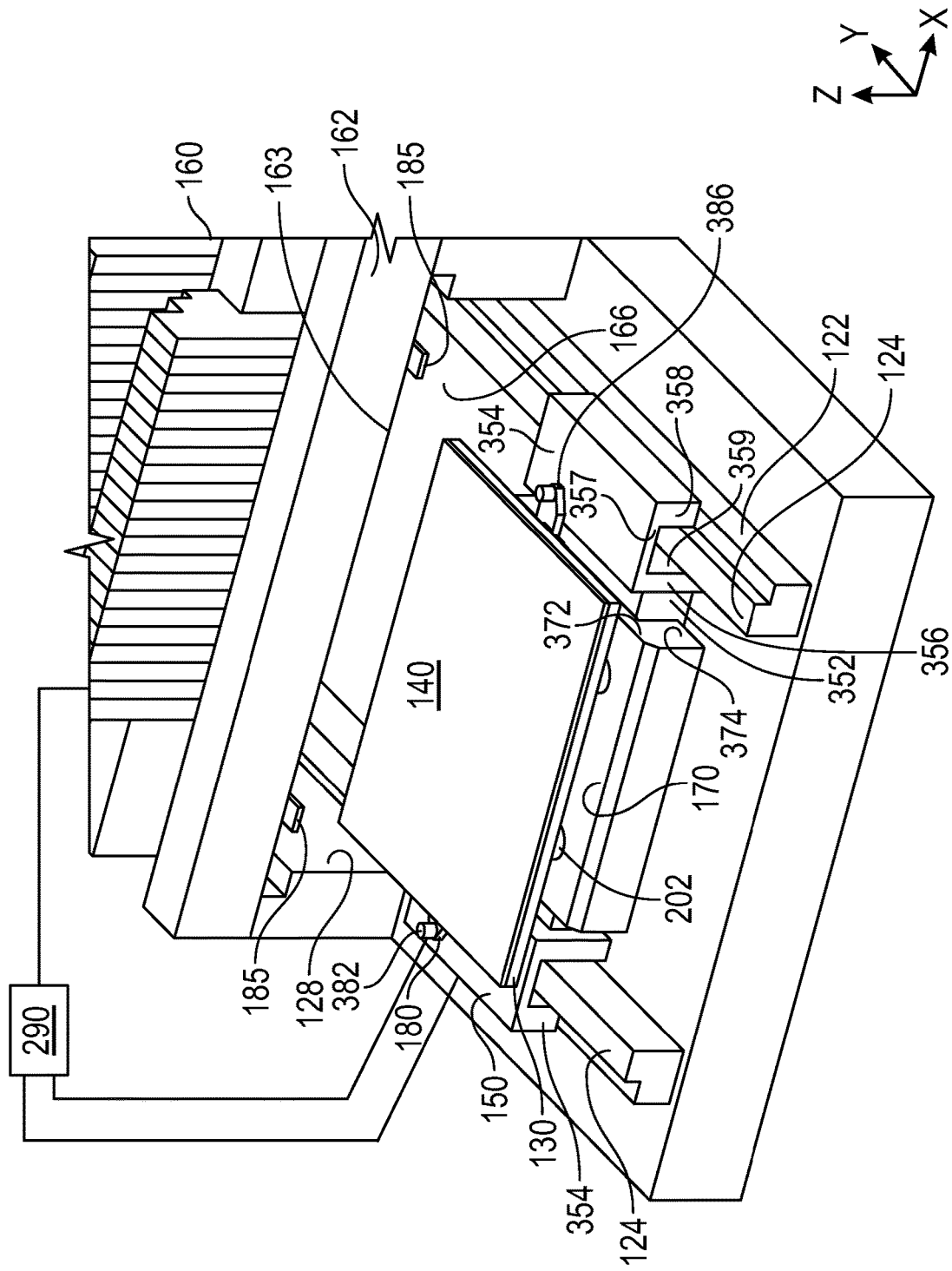
FIG. 2 is a perspective schematic view of the shuttle assembly according to one embodiment.

The system 100 also includes a controller 290 (See FIG. 2). The controller 290 is designed to facilitate the control and automation of the processing techniques described herein. The controller 290 is coupled to or in communication with one or more of the processing system 100, the chucks 130, the shuttles 150, 170, the read head sensors 382, and the processing apparatus 160, depending upon the desired implementation. The scales 185 of the processing system 100 are read by the read head sensors 382 to generate and provide information to the controller 290 regarding the substrate position and alignment. For example, the processing apparatus 160 provides information to the controller 290 to alert the controller 290 that substrate processing has been completed based, at least in part, on the position of the chucks 130 relative to the processing apparatus 160. The location information provided to the controller 290 is then used to control the position of the chucks 130 and the digital patterns projected from the processing apparatus 160.

The controller 290 includes a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include conventional cache, power supplies, clock circuits, input/output circuitry, subsystems, and the like. A program (software or computer instructions) readable by the controller 290 determines which tasks are performable on the substrate 140. In one example, the program is software readable by the controller 290 and includes code to monitor and control, for example, the processing time and substrate position.

FIG. 2 is a perspective schematic view of the shuttle assembly according to one embodiment. The first shuttle 150 has a main body 352 and guides 354. In one embodiment, the main body 352 and the guides 354 are a unitary member fabricated from the same material. In another embodiment, the main body 352 and guides 354 are separate components coupled together and are fabricated from the same material or different materials. The guides 354 are disposed on the pair of guiderails 124.

The guides 354 have an inner surface 356, a top surface 357, and an outer surface 358. The inner surface 356, top surface 357, and outer surface 358 define a recess 359. The recess 359 is shaped and configured to ride along or be guided by the guiderails 124. The inner surface 356 of the guide 354 is coupled to the main body 352 of the first shuttle 150. The main body 352 has a length in the Y-direction less than a distance between the opposing guiderails 124. At least one motor (not shown), such as a linear motor of the like, is disposed within the first shuttle 150 to move the guides 354 along guiderails 124.

The second shuttle 170 is disposed over the main body 352 of the first shuttle 150. The second shuttle 170 has a length in the Y-direction less than a length of the main body 352. The second shuttle 170 has a main body 372 and overhangs 374. In one embodiment, the main body 372 and the overhangs 374 are a unitary member fabricated from the same material. The overhangs 374 extend from the main body 372 downward along and adjacent to the main body 352 of the first shuttle 150. At least one motor is disposed within the second shuttle 170 to move the second shuttle 170 along the main body 352 of the first shuttle 150 in the Y-direction. In one embodiment, the second shuttle 170 is configured to move a magnitude of between about 1 mm and about 200 mm in the Y-direction. Alternatively, the motor may be utilized to move the second shuttle 170 along the main body 352 in the X-direction.

A plurality of actuators 202 are disposed on the second shuttle 170. The chuck 130 is disposed on the plurality of actuators 202 such that the actuators 202 are disposed between the second shuttle 170 and the chuck 130. The actuators 202 enable the chuck 130 to move in a third direction, such as the Z-direction. Movement of the chuck 130 in the third direction enables the system 100 to adjust for a varying thickness of the substrate 140 during processing by the processing unit 160. The actuators 202 are mechanical actuators, electrical actuators, pneumatic actuators, hydraulic actuators, or other type of actuator capable of precise movement of the chuck 130. In one example, the actuators 202 are air bearings or the like.

The metrology bar 180 is coupled to a bottom of the chuck 130. Distal ends 386 of the metrology bar 180 extend laterally beyond a perimeter of the chuck 130. The material of the metrology bar 180 is chosen to be light weight, thermally stable, and have a high specific thickness. In one embodiment, the material of the metrology bar 180 is a ceramic material, such as silicon carbide. In another embodiment, the metrology bar 180 is made of a metal, such as magnesium. The metrology bar 180 includes the read head sensors 382 (a first plurality of sensors) coupled to the distal ends 386 of the metrology bar 180. In operation, the sensors 382 are utilized to determine the relative position of the chuck 130, and thus the substrate 140, in the first direction, such as the X-direction.

Figure 3:
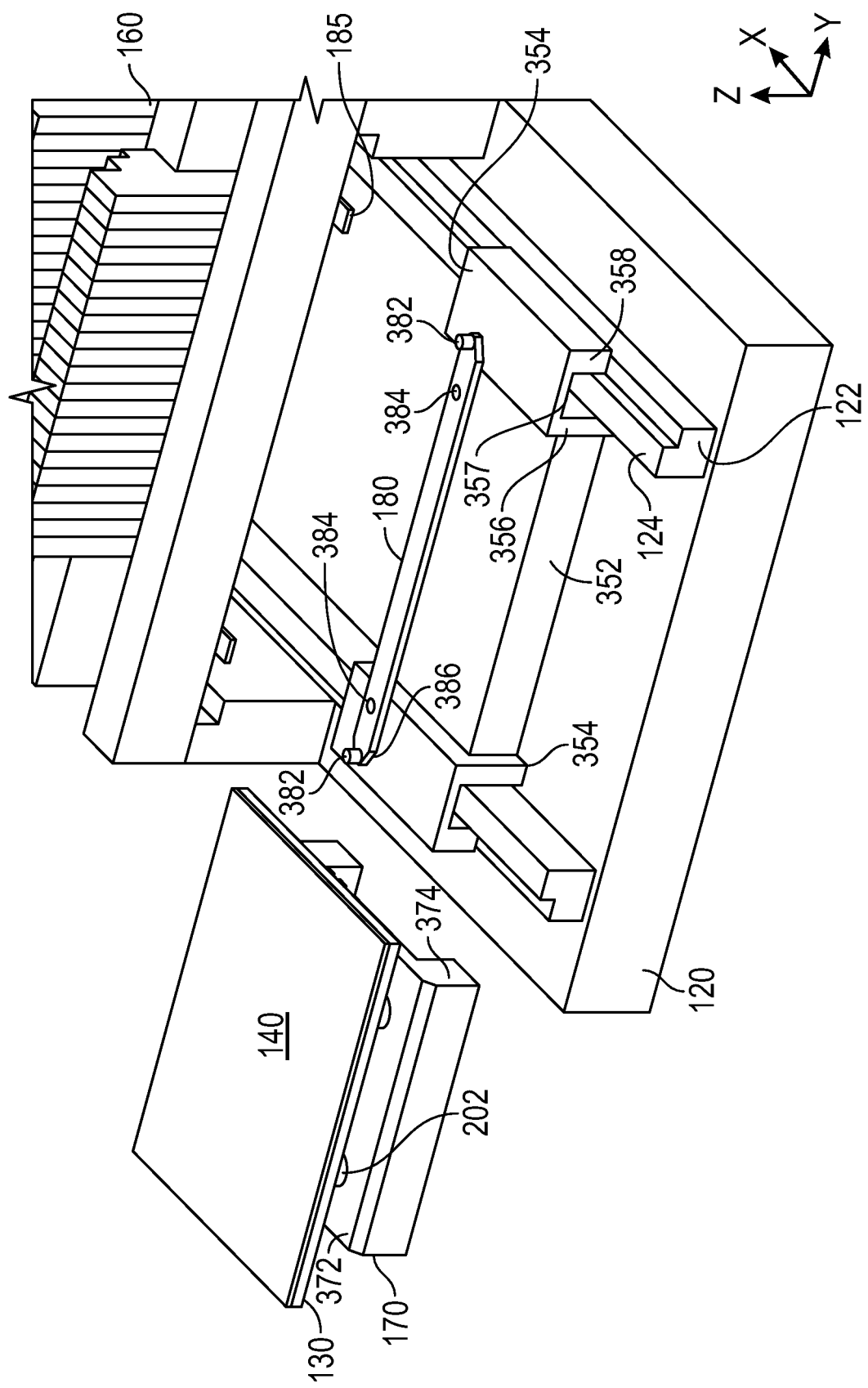
FIG. 3 is an exploded view of the shuttle assembly according to one embodiment.

FIG. 3 illustrates an exploded view of the shuttle assembly of FIG. 2 according to one embodiment of the disclosure. The metrology bar 180 has a second plurality of sensors 384 coupled to or disposed within the metrology bar 180. The second plurality of sensors 384 are disposed laterally inwards of the first plurality of sensors 382. In operation, the second plurality of sensors 384 are utilized to determine the relative position of the chuck 130, and thus the substrate 140, in the second direction, such as the Y-direction. In one embodiment, the sensors 382, 384 are optical encoders. In another embodiment, the sensors 382, 384 are magnetic capacitive sensors. In yet another embodiment, the sensors 382, 384 are inductive linear encoders.

Encoders, such as sensors 382, 384, are a position measurement tool having numerous advantages over other measurement tools, such as interferometers. Encoders are thin, one-dimensional devices not inherently suited to measuring locations in a two-dimensional area. An encoder, such as sensors 382, is used to measure the position of the first shuttle 150 with respect to the granite slab 120 and an encoder, such as sensors 384, is used to measure the position of the second shuttle 170 with respect to the first shuttle 150. Measurements obtained from the sensors 382, 384 are typically displaced vertically from the top surface of the substrate 140. Any tipping or undesirable displacement between the shuttles 150, 170 and the slab 120 results in a metrology error known as an Abbe offset error. Ideally, the sensors 382, 384 are positioned coplanar with the top surface of the substrate 140 thereby nulling any Abbe offset errors.

Figure 4:
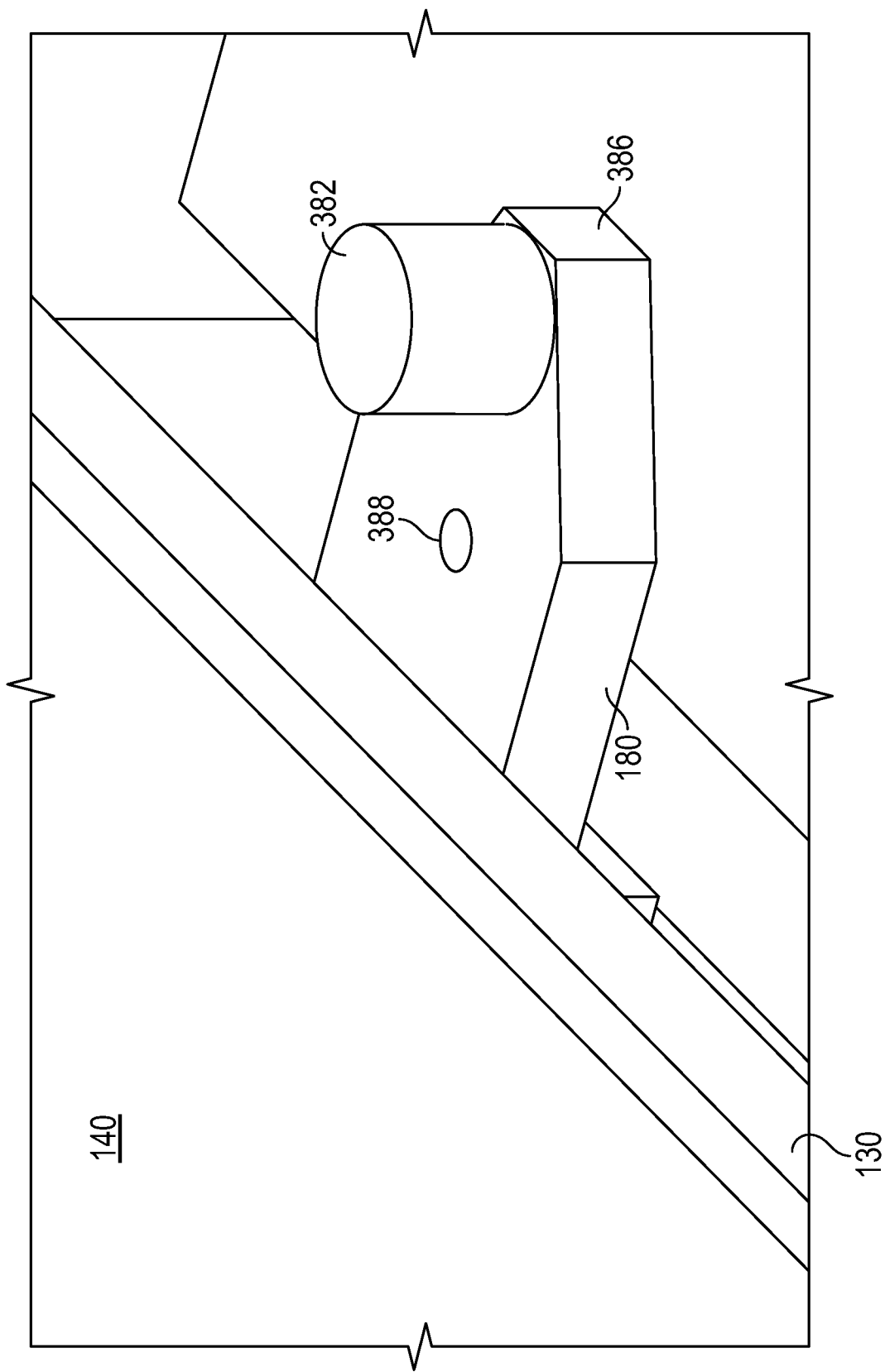
FIG. 4 is an enlarged schematic view of the metrology bar according to one embodiment disclosed herein.
Figure 5:
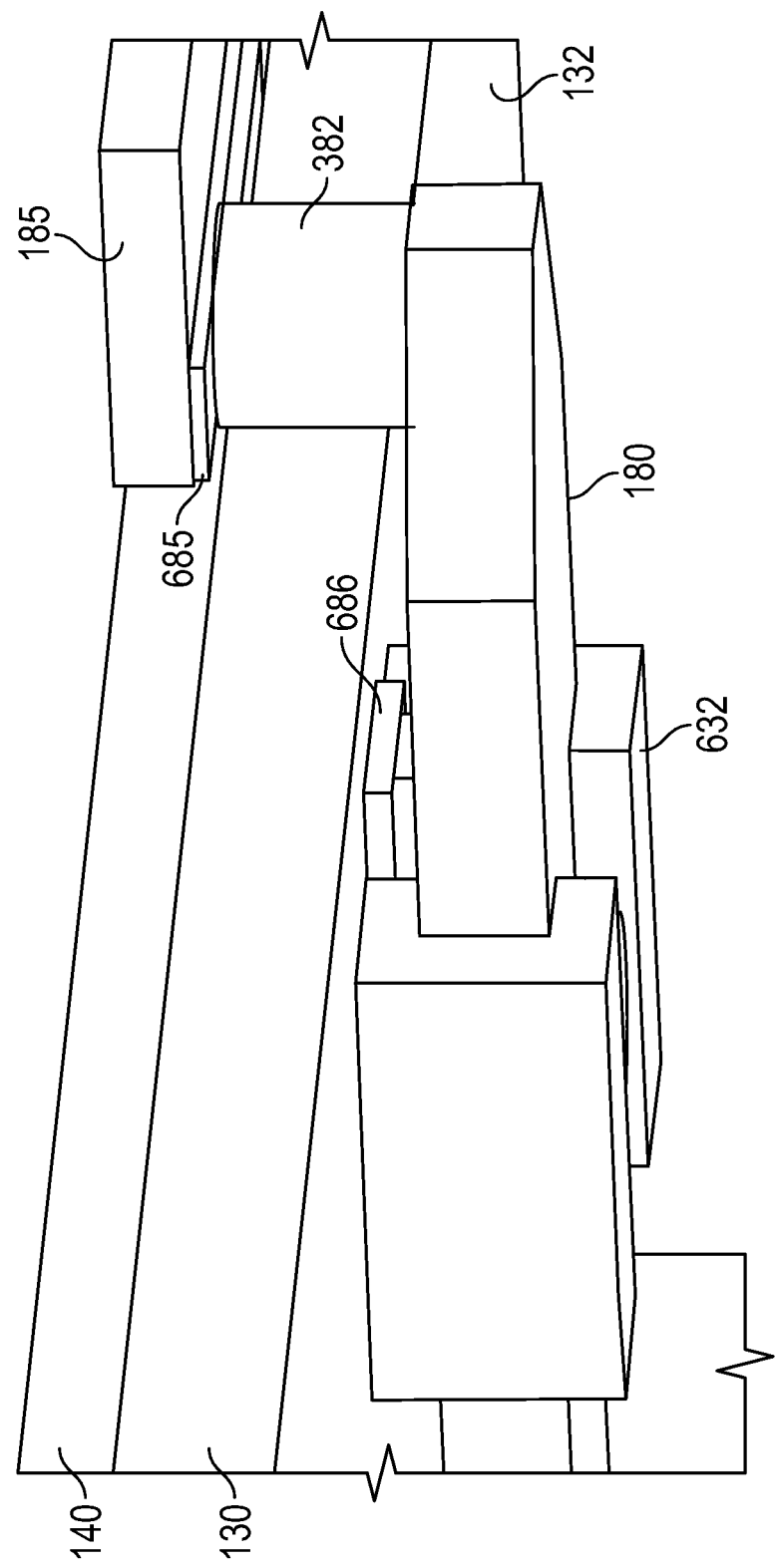
FIG. 5 is a schematic view of the mounting mechanism of the metrology bar according to one embodiment.

FIG. 4 illustrates top perspective view of the first plurality of sensors 382 positioned on the distal ends 386 of the metrology bar 180. FIG. 5 illustrates a bottom perspective view of the metrology bar 180 mounted to the chuck base 132. The metrology bar 180 is disposed within bearings 632. The bearings 632 are coupled to the chuck base 132. In one embodiment, the bearings 632 are air bearings. Alternatively, the bearings 632 are magnetic bearings. The bearings 632 are disposed on opposite sides of the metrology bar 180 and the metrology bar 180 extends through the bearings 632. The bearings 632 are configured to provide substantially frictionless movement of the metrology bar 180 relative to the chuck base 132.

A first plurality of scales 686 are coupled to the chuck base 132 between the bearings 632. The first plurality of scales 686 are disposed opposite of the second plurality of sensors 384 of the metrology bar 180. The scales 686 are made of a glass material. In one embodiment, the glass is a zero-expansion glass material. In another embodiment, the glass thermally expands up to about 9 microns. The scales 686 include features, such as etchings or the like, which are readable by the second plurality of sensors 384 to determine a position of the metrology bar in the Y-direction. In one embodiment, the features are fine grating structures which are etched into a surface of the scales 686. Similar to the scales 686, the scales 185 include features, such as etched grating patterns or the like, which are readable by the first plurality of sensors 382 to determine a position of the metrology bar 180 in the X-direction. The encoder scale 185 includes an encoder strip 685 containing the grating pattern features disposed opposite of the guiderails 124. In one embodiment, the scale 185 and encoder strip 685 with grating features are substantially vertically aligned with the guiderails 124. In another embodiment, a sliding collar attached to the scale 185 is used to align the first plurality of sensors 382 with the pattern features of the encoder strip 685. In another embodiment, an attachment to the first shuttle 150 or a servo mechanism is used to maintain alignment with the encoder strip 685.

The bearings 632 enable the position of metrology bar 180 to remain fixed as the second shuttle 170 moves with respect to the first shuttle 150, enabling the sensor 382 attached to the metrology bar 180 to detect a position relative to an encoder, such as the scales 185, thus providing one position coordinate. A second read head, such as the sensor 384, is attached to the metrology bar 180 to detect a position relative to an encoder, such as the scales 686, providing a second, orthogonal position coordinate. Both sensors 382, 384, are positioned coplanar to the top surface of the substrate 140 in order to minimize Abbe offset errors. The accuracy of the position obtained from the second read head, such as sensor 384, is dependent on the position of the metrology bar 180 with respect to the centerline of the encoder scales 185 attached to the slab 120. In one embodiment, a second encoder feature pattern is added to the encoder strip 685 with features perpendicular to the first encoder feature pattern, enabling any positioning error of the metrology bar 180 to be accurately measured and the position error to be corrected.

In one embodiment, the plurality of sensors 382, 384, are disposed on the metrology bar 180 and the stationary encoder scales 185, 686 are disposed opposite of the sensors 382, 384. In another embodiment, locations of the scales 185, 686 and sensors 382, 384 are reversed in which the scales 185, 686 may be disposed on the metrology bar 180 while the sensors 382, 384, are disposed on the slab 120 and second shuttle 170, respectively.

In operation, the first plurality of sensors 382 provide the processing apparatus 160 with information, via the controller 290, indicating the relative position of the chuck 130, and thus the substrate 140, in the first direction, such as the X-direction, as the first shuttle 150 moves along the guiderails 124 in the first direction. The second plurality of sensors 384 provide the processing apparatus 160 with information, also via the controller 290, indicating the relative position of the chuck 130, and thus the substrate 140, in the second direction, such as the Y-direction, as the second shuttle 170 moves along the main body 352 of the first shuttle 150 in the second direction. In one embodiment, the processing apparatus 160 and/or the controller 290 utilize the relative position information generated by the sensors 382, 384 to calculate the yaw angle, or the rotation about the Z-axis of the chuck 130. Such calculations are possible because the relative position in the first direction and the relative position in the second direction are detected by the sensors 382, 384.

Referring back to FIG. 4, a third plurality of sensors 388 are disposed in the metrology bar 180 to measure the relative position of the substrate 140 in the third direction, such as the Z-direction. In one embodiment, the third plurality of sensors 388 are coupled to or otherwise disposed within the metrology bar 180 between the first plurality of sensors 384 and the second plurality of sensors 384. In one embodiment, the sensors 388 are optical sensors which determine a distance in the Z-direction between the sensors 388 and a bottom surface of the substrate 140. The third plurality of sensors 388 are interrogated by a third stationary encoder scale (not pictured). The third stationary encoder scales are mounted to the support 162 within the opening 166 and run parallel to the first stationary encoder scale 185. Alternatively, the sensors 388 determine a distance in the Z-direction between the sensors 388 and the chuck base 132. It is contemplated that information derived from the sensors 388 is utilized to compensate for thickness variations of the substrate 140 in the Z-direction as well as variations of the guiderails 124. The aforementioned configuration provides two sensors 382, 388 capable of monitoring the substrate position in the direction of the first guiderail 124. The average of the positions generated from the two sensors 382,

388 is an accurate measurement of the position of the substrate 140. In another embodiment, the position of the substrate 140 is derived from a weighted average of the positions generated from the two sensors 382, 388. In this embodiment, the weighting varies depending on the position of the metrology bar 180 with respect to the second shuttle 170. The difference between the two readings is a measure of the twisting of the second shuttle 170 in the Z-direction, which is the direction of the plane of the substrate 140.

In one embodiment, the sensors 382, 384, 388 are optical encoder read heads and the scales 686, 185 are made of zero-expansion glass. The optical encoder read heads 382, 384, 388 utilize LED light or laser light. In one embodiment, a layer of reflective film is deposited on the scales 686, 185 (and scale features) and etched to create a precision grating pattern. Projecting the grating pattern from the read head devices onto the matching grating pattern of the scales 686, 185 creates sinusoidal variations in the reflected light as the sensors 382, 384 move with respect to the scales 686, 185. The sinusoidal oscillations read by the sensors 382, 384 provide the relative position of the substrate 140 to the processing apparatus 160. Furthermore, the sinusoids are converted to a distance, providing accuracy between about 1 nanometer (nm) to about 10 nm. Thus, the system 100 is capable of extremely fine position detection via utilization of the metrology bar 180 and the described sensors 382, 384, and scales 686, 185.

Figure 6:
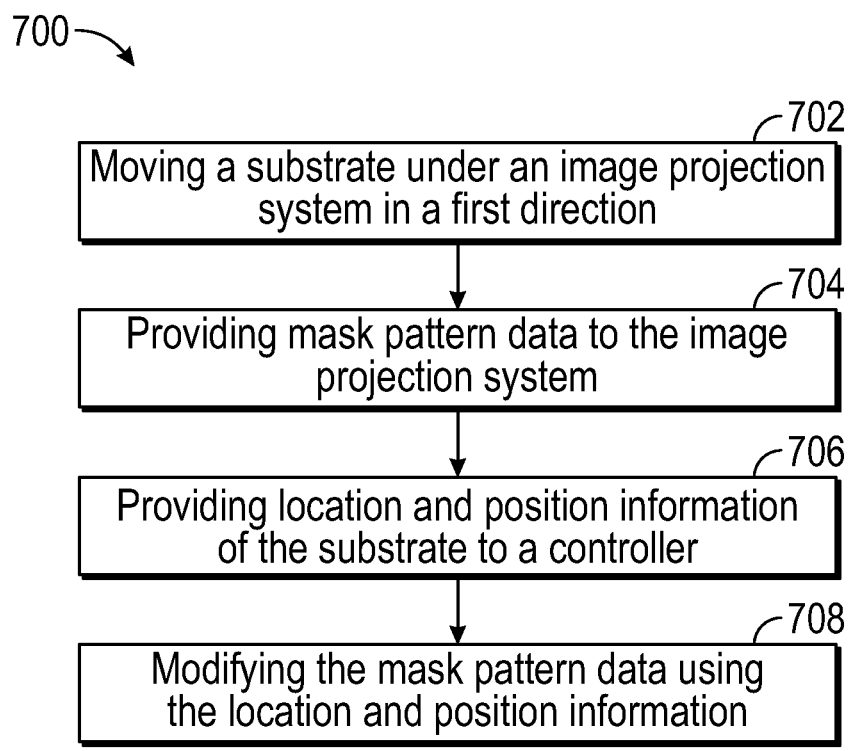
FIG. 6 illustrates steps for reducing positional errors of a pattern formed on a substrate according to various embodiments.

FIG. 6 illustrates operations of a method 700 for reducing positional errors of a pattern formed on a substrate according to various embodiments. At block 702, a substrate is moved under an image projection (e.g. processing apparatus 160) in a first direction, such as the X-direction. The substrate may be the substrate 140 disposed on the chuck 130 of the system 100. The substrate 140 includes a surface that is to be patterned by the plurality of image projection systems. At block 704, mask pattern data is provided to the image projection system. Next, at block 706, location and position information of the moving substrate are provided to the controller 290 for each process sequence. The location and position of the moving substrate is used to modify the mask pattern data, as shown at block 708. In addition to forming the predetermined pattern on the surface of the substrate by using operations of the method 700, when the location and position of the substrate have deviated from the predetermined location and position, operations of the method 700 are utilized to match a pattern exposed from other exposure tools on the surface of the substrate using the system 100.

In addition to the operations of method 700 shown in FIG. 6, positional errors of the pattern formed on the substrate may be further reduced by reducing the electromagnetic energy delivered to the surface of the substrate during each process sequence. In other words, a single light image pixel formed on an area of the surface of the substrate is not light enough to form the pattern, and it may take a plurality of light image pixels to accumulate on the same area to be light enough to form the pattern. In this manner, if the location of any single light image pixel on the surface of the substrate is incorrect, the single light image pixel does not contain enough energy to form the pattern. Since the location of the subsequent light image pixel are corrected using the operations of method 700 described in FIG. 6, the positional errors of the pattern formed on the substrate are further reduced.

In summation, embodiments described herein provide for an improved maskless lithography system. The system utilizes a metrology bar and associated sensors which are utilized to determine the position of a chuck, and thus a substrate, relative to an imaging process unit. In addition, a plurality of shuttles are utilized to move the chuck in X and Y directions to correct for potential alignment of the substrate during processing. As will be apparent from the foregoing description, maskless lithography errors may be reduced utilizing the apparatus and methods described herein.

What is claimed is:

1. A substrate processing apparatus, comprising:
a slab;
at least one guiderail coupled to and extending along the slab;
a first shuttle disposed on the at least one guiderail;
a second shuttle disposed on the first shuttle; and
a metrology bar coupled to a bottom of a chuck that is disposed on the second shuttle, wherein each distal end of the metrology bar extends laterally beyond a perimeter of the chuck, the metrology bar comprising:
at least one first sensor coupled to at least one distal end of the metrology bar; and
at least one second sensor laterally inward of the at least one first sensor.

2. The apparatus of claim 1, wherein air bearings are disposed on opposite sides of the metrology bar.

3. The apparatus of claim 2, further comprising:
a second scale coupled to the chuck.

4. The apparatus of claim 3, wherein the second scale is disposed opposite the at least one second sensor.

5. The apparatus of claim 1, further comprising:
a processing unit coupled to the slab by a support.

6. The apparatus of claim 5, further comprising:
a first scale coupled to the support opposite the at least one guiderail.

7. The apparatus of claim 1, wherein the at least one second sensor is recessed within the metrology bar and the at least one first sensor extends from the metrology bar.

8. The apparatus of claim 1, wherein the first shuttle comprises one or more first motors and the second shuttle comprises one or more second motors.

9. The apparatus of claim 8, wherein the first motors are configured to move the first shuttle in a first direction and the second motors are configured to move the second shuttle in a second direction normal to the first direction.

10. The apparatus of claim 9, wherein the second motors are configured to move the second shuttle a magnitude of between about 1 mm and about 300 mm in the second direction.

11. The apparatus of claim 1, wherein the at least one first sensor and the at least one second sensor comprise optical sensors.

12. A substrate processing apparatus, comprising:
a slab;
at least one guiderail coupled to and extending along the slab;
a processing unit coupled to the slab by a support;
a first shuttle disposed on the at least one guiderail;
a second shuttle disposed on the first shuttle;
a chuck disposed on the second shuttle; and
a metrology bar coupled to a bottom of the chuck, wherein each distal end of the metrology bar each extends laterally beyond a perimeter of the chuck, the metrology bar comprising:
at least one first scale coupled to the metrology bar; and
at least one second scale coupled to the metrology bar laterally inward of the at least one first scale.

13. The apparatus of claim 12, further comprising:
a first sensor coupled to the support opposite the at least one guiderail.

14. The apparatus of claim 12, wherein air bearings are disposed on opposite sides of the metrology bar.

15. The apparatus of claim 12, wherein the first shuttle comprises one or more first motors and the second shuttle comprises one or more second motors.

16. The apparatus of claim 15, wherein the first motors are configured to move the first shuttle in a first direction and the second motors are configured to move the second shuttle in a second direction normal to the first direction.

17. The apparatus of claim 13, wherein a second sensor is coupled to the chuck.

18. The apparatus of claim 17, wherein the first sensor and second sensor comprise optical sensors.

19. A substrate processing method, comprising:
positioning a substrate on a chuck, wherein the chuck is coupled to a second shuttle disposed on a first shuttle;
determining, via a metrology bar coupled to a bottom of the chuck comprising one of a first sensor or scale and one of a second sensor or scale coupled to the metrology bar laterally inward of the first sensor or scale, a position of the substrate within a processing unit, wherein each distal end of the metrology bar extends laterally beyond a perimeter of the chuck; and
in response to determining the position of the substrate, moving one or both of the first shuttle and the second shuttle to position the substrate relative to the processing unit.

* * * * *